United States Patent
Sato

(10) Patent No.: US 6,278,951 B1
(45) Date of Patent: Aug. 21, 2001

(54) CROSSTALK NOISE CALCULATION METHOD AND STORAGE MEDIUM

(75) Inventor: Toshiro Sato, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/225,357

(22) Filed: Jan. 5, 1999

(30) Foreign Application Priority Data

Jul. 15, 1998 (JP) ................................................. 10-200689

(51) Int. Cl.$^7$ .................................................. H04B 3/32
(52) U.S. Cl. ............................................. 702/57; 455/295
(58) Field of Search .................... 702/57, 69; 455/226.3, 455/295; 324/612; 370/201

(56) References Cited

U.S. PATENT DOCUMENTS

| | | | |
|---|---|---|---|
| 3,662,117 | * 5/1972 | Bhatt et al. ............................ | 379/292 |
| 4,293,739 | * 10/1981 | Iijima ..................................... | 379/417 |
| 4,852,074 | * 7/1989 | Tamaka et al. ........................ | 395/53 |
| 5,446,674 | * 8/1995 | Ikeda et al. ............................ | 716/5 |
| 5,481,695 | * 1/1996 | Purks ..................................... | 703/15 |
| 5,502,644 | * 3/1996 | Hamilton et al. ..................... | 716/5 |
| 5,539,321 | * 7/1996 | Sciaccero ............................... | 324/68 |
| 5,548,222 | * 8/1996 | Jensen et al. .......................... | 324/68 |
| 5,568,395 | * 10/1996 | Huang .................................... | 716/4 |

FOREIGN PATENT DOCUMENTS 7-182405 7/1995 (JP).
9-147009 6/1997 (JP).

* cited by examiner

Primary Examiner—Kamini Shah
Assistant Examiner—Edward Raymond
(74) Attorney, Agent, or Firm—Staas & Halsey LLP

(57) ABSTRACT

A crosstalk noise calculation method for calculating crosstalk noise among a plurality of wirings, includes calculating a crosstalk noise using a function in which the crosstalk noise becomes approximately constant when a predetermined wiring length is exceeded, so as to improve the design efficiency of the wirings by preventing an excessively strict checking from being performed.

18 Claims, 10 Drawing Sheets

PRIOR ART

CROSSTALK NOISE CALCULATION METHOD AND STORAGE MEDIUM

BACKGROUND OF THE INVENTION

The present invention generally relates to crosstalk noise calculation methods and storage mediums, and more particularly to a crosstalk noise calculation method for calculating a crosstalk noise of an adjacent wiring and to a computer-readable storage medium which stores a program for causing a computer to calculate the crosstalk noise using such a crosstalk noise calculation method.

When wirings to be formed on an assembling board of a computer, printed circuit board, printed wiring board and the like are designed by computer aided design (CAD), a crosstalk noise between adjacent wirings may exceed a tolerable range due to an error in the design, an error in the wiring rule or the like. For this reason, it is necessary to finally determine the wirings by checking whether or not the crosstalk noise falls within the tolerable range. The crosstalk noise between the adjacent wirings can be obtained by simulation. But in the case of the assembling board of a personal computer, for example, there are more than 1000 wirings. Further, the number of wirings is more than ten times that of the assembling board of the personal computer, that is, more than 10000, in the case of the assembling board of a work station, super computer and the like. Hence, it takes too much time to obtain the crosstalk for all of the wirings by simulation.

Accordingly, the crosstalk noise of the wiring is obtained by calculation, and the wiring is determined so that the calculated crosstalk noise falls within the tolerable range.

FIG. 1 is a diagram for explaining a conventional crosstalk noise calculation method. In FIG. 1, the ordinate indicates a peak value of the crosstalk noise, and the abscissa indicates a length of parallel wirings (hereinafter referred to as a parallel wiring length).

As may be seen from FIG. 1, the crosstalk noise is conventionally calculated using a function F by assuming that the peak value of the crosstalk noise is simply proportional to the adjacent wiring length. In the conventional assembling board and the like, the density of the wirings is relatively low, the wiring length is relatively short, and a transfer rate of a signal flowing through the wirings is relatively low. For these reasons, the crosstalk noise calculated using the function F shown in FIG. 1 was a relatively good approximation, and in addition, the calculation itself was also simple.

However, due to the increased operation speeds of CPUs and the development of high-speed memory elements, the wiring density on the assembling board and the like has recently increased, the wiring length has increased, and the transfer rate of the signal flowing through the wiring also has increased. As a result, when the crosstalk is calculated using the conventional method described above, even in a case where the crosstalk of 10% or less of the total number of wirings actually does not fall within the tolerable range, the check result obtained by the conventional method in an extreme case may indicate that the crosstalk of 50% or more of the total number of wirings does not fall within the tolerable range. When the check result is based on such an excessively strict checking, there is a problem in that the design efficiency of the wiring greatly deteriorates.

Such an excessively strict checking is made according to the conventional method because the peak value of the crosstalk noise is assumed to be simply proportional to the adjacent wiring length, even though the peak value of the crosstalk noise actually saturates and becomes approximately constant when a predetermined wiring length is exceeded as will be described later.

SUMMARY OF THE INVENTION

Accordingly, it is a general object of the present invention to provide a novel and useful crosstalk noise calculation method and storage medium, in which the problems described above are eliminated.

Another and more specific object of the present invention is to provide a crosstalk noise calculation method which can accurately calculate a crosstalk noise of an adjacent wiring and improve a design efficiency of the wiring by preventing an excessively strict checking, and to provide a computer-readable storage medium which stores a program for causing a computer to calculate the crosstalk noise using such a crosstalk noise calculation method.

Still another object of the present invention is to provide a crosstalk noise calculation method for calculating crosstalk noise among a plurality of wirings, comprising the steps of calculating a crosstalk noise using a function in which the crosstalk noise becomes approximately constant when a predetermined wiring length is exceeded. According to the crosstalk noise calculation method of the present invention, it is possible to accurately calculate the crosstalk noise of the adjacent wirings, and to improve the design efficiency of the wirings by preventing an excessively strict checking from being performed.

A further object of the present invention is to provide a computer-readable storage medium which stores a program for causing a computer to calculate crosstalk noise among a plurality of wirings on a substrate, comprising means for causing the computer to calculate a crosstalk noise using a function in which the crosstalk noise becomes approximately constant when a predetermined wiring length is exceeded. According to the computer-readable storage medium of the present invention, it is possible to accurately calculate the crosstalk noise of the adjacent wirings, and to improve the design efficiency of the wirings by preventing an excessively strict checking from being performed.

Other objects and further features of the present invention will be apparent from the following detailed description when read in conjunction with the accompanying drawings.

DESCRIPTION OF THE PREFERRED EMBODIMENTS

Figure 2:
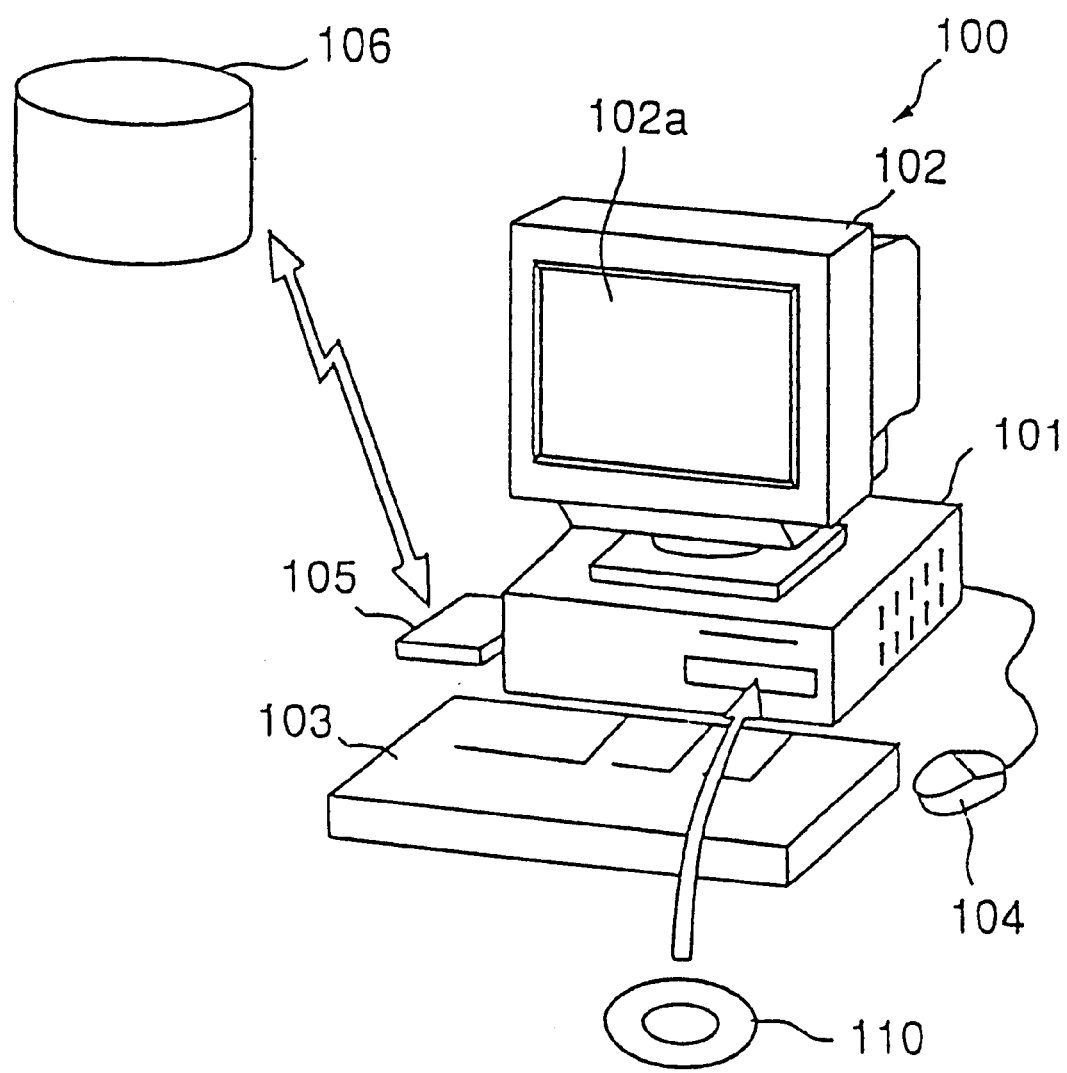
FIG. 2 is a perspective view showing a computer system capable of realizing an embodiment of a crosstalk noise calculation method according to the present invention.

FIG. 2 is a perspective view showing a computer system capable of realizing an embodiment of a crosstalk calculation method according to the present invention. This embodiment of the crosstalk noise calculation method calculates a crosstalk noise based on a program stored in an embodiment of a storage medium according to the present invention.

A computer system 100 shown in FIG. 2 is made up of a general purpose computer system such as a personal computer. The computer system 100 generally includes a main body 101, a display unit 102, a keyboard 103, a mouse 104 and a modem 105. The main body 101 includes a CPU, a disk drive and the like. The display unit 102 includes a display screen 102a which displays an image based on an instruction from the main body 101. The keyboard 103 is used to input various information to the computer system 100. The mouse 104 is used to specify an arbitrary position on the display screen 102a of the display unit 102. The modem 105 is used to make an access to an external database and the like, and to download a program or the like stored in another computer system. The program which is stored in a portable recording medium such as a disk 110 or is downloaded from a recording medium 106 of another computer system using the communication unit such as the modem 105 is input to the computer system 100 and compiled. This program includes a program for causing the CPU of the computer system 100 to calculate the crosstalk noise according to this embodiment of the crosstalk noise calculation method.

Figure 3:
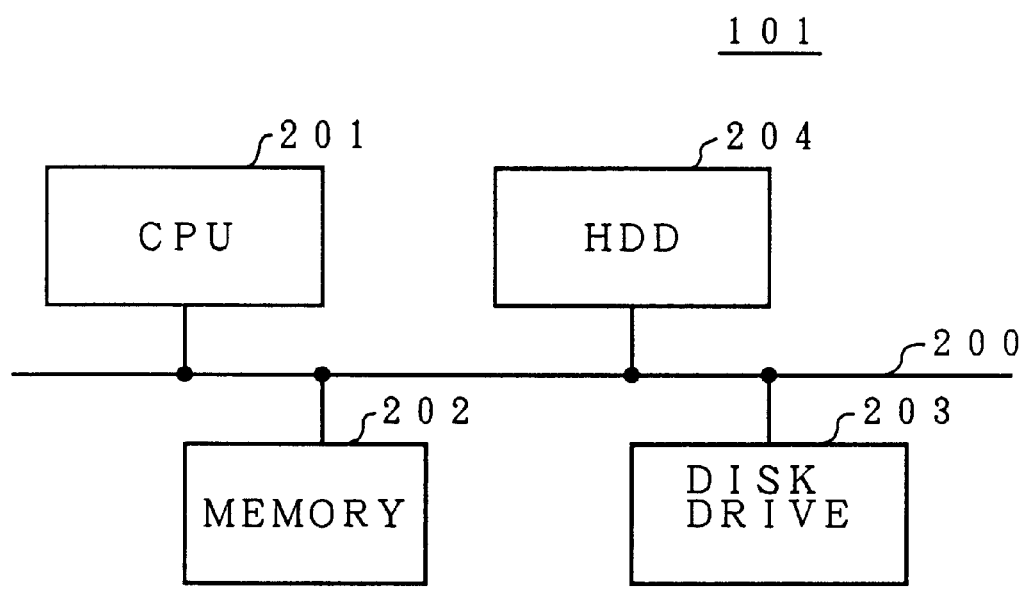
FIG. 3 is a system block diagram showing the construction of an important part of a main body of the computer system.

FIG. 3 is a system block diagram showing the structure of an important part within the main body 101 of the computer system 100.

In FIG. 3, the main body 101 generally includes a CPU 201, a memory 202, a disc drive 203 and a hard disk drive 204 which are coupled by a bus 200. The CPU 201 is made of a known processor unit and controls the entire operation of the computer system 100. The memory 202 is made up of a RAM, ROM and the like, and stores programs to be executed by the CPU 201, intermediate data obtained during computations carried out by the CPU 201, and various other data. The disk drive 203 has a known construction for writing data to and/or reading data from the disk 110 which is loaded with respect to the disk drive 203. The hard disk drive 204 has a known construction for writing data to and/or reading data from a hard disk accommodated therein. For example, the program which is to be executed by the CPU 201 may be read from the disk 110 by the disk drive 203 and stored in the memory 202 or, may be pre-installed in the hard disk of the hard disk drive 204 and read from the hard disk and stored in the memory 202.

Of course, the construction of the computer system 100 is not limited to that shown in FIGS. 2 and 3, and it is possible to use computer systems having various other known constructions to realize the present invention.

This embodiment of the storage medium is formed by a computer-readable recording medium such as the disk 110 which stores a program for causing a computer such as the CPU 201 to calculate the crosstalk noise according to this embodiment of the crosstalk calculation method. The recording medium may be any type of medium capable of storing information, such as an IC card memory, floppy disk, magneto-optic disk, CD-ROM, and various semiconductor memory devices. In addition, the recording medium is not limited to a medium which is portable or removable with respect to the computer. Furthermore, the recording medium may be a medium accessible from a computer system via a communication unit or a communication means such as a modem and a LAN.

Figure 4:
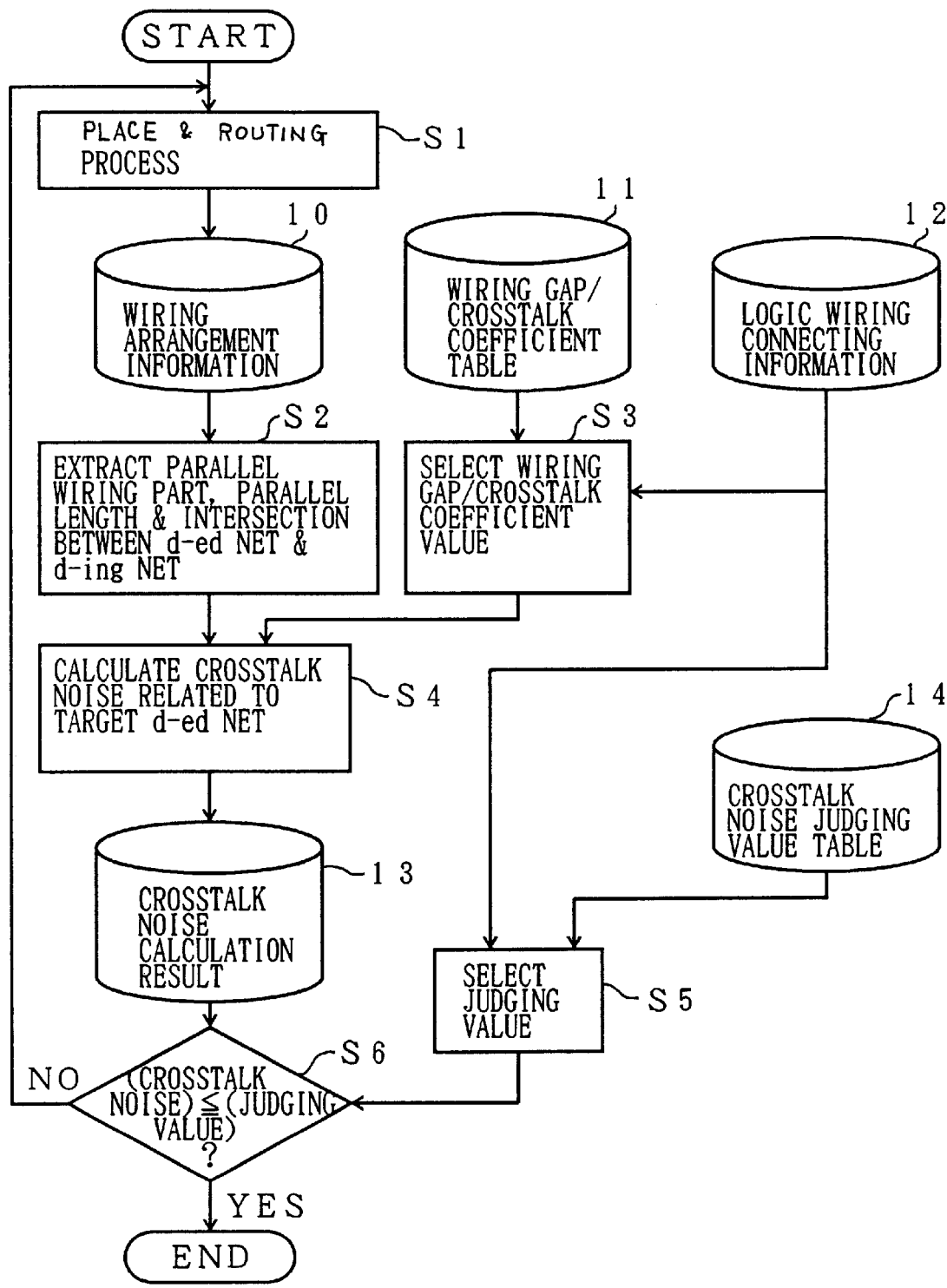
FIG. 4 is a flow chart for generally explaining a crosstalk calculation process.

FIG. 4 is a flow chart for generally explaining a crosstalk calculation process of this embodiment. In FIG. 4, a step S1 carries out a known place and routing process to obtain an arrangement of wirings on a substrate based on design data, and stores wiring arrangement information which is obtained into a memory region 10 within the memory 202 shown in FIG. 3, for example. A step S2 extracts nets based on the wiring arrangement information stored in the memory region 10. The nets which are extracted include a net (hereinafter referred to as a d-ed net) which receives a crosstalk noise from among an adjacent wiring, from among a parallel wiring part, a parallel wiring length, an intersecting part and a parallel wiring part, and a net (hereinafter referred to as a d-ing net) which applies a crosstalk noise with respect to the adjacent wiring from among a parallel wiring part.

On the other hand, a table which indicates a relationship between a wiring gap between adjacent wirings depending on the design data and a crosstalk coefficient is stored in a memory region 11 within the memory 202, for example. Further, logic wiring connecting information depending on the design data is stored in a memory region 12 within the memory 202, for example. A step S3 selects values of the crosstalk coefficient and the wiring gap corresponding to the logic wiring connecting information from the table stored in the memory region 11, based on the logic wiring connecting information stored in the memory region 12.

A step S4 calculates a crosstalk noise related to a target d-ed net, based on the parallel wiring part, the parallel wiring length, the intersecting part, the d-ed net, the d-ing net and the like extracted in the step S2 and the values of the wiring gap and the crosstalk coefficient selected in the step S3. The step S4 also stores a calculation result of the crosstalk noise in a memory region 13 within the memory 202, for example.

A table of crosstalk noise judging values is stored in a memory region 14 within the memory 202, for example. The crosstalk noise judging value is used to judge whether or not the calculation result of the crosstalk noise exceeds a tolerable range, and the crosstalk noise judging value differs depending on the logic wiring connecting information. Accordingly, a step S5 selects the crosstalk noise judging value corresponding to the logic wiring connecting information from the table stored in the memory region 14, based on the logic wiring connecting information stored in the memory region 12.

A step S6 uses the crosstalk noise judging value selected in the step S5, and decides whether or not the calculated result of the crosstalk noise stored in the memory region 13 is greater than or equal to the crosstalk noise judging value. If the decision result in the step S6 is NO, the process returns to the step S1, so as to carry out the place and routing process so as to make the crosstalk noise fall within the tolerable range. On the other hand, if the decision result in the step S6 is YES, the crosstalk noise is within the tolerable range, and the process ends.

If the decision result in the step S6 is NO, it is possible to display a message on the display screen 102a of the display unit 102 or notify the user by generating an alarm, for example.

This embodiment is particularly characterized by the process carried out in the step S4 described above.

Figure 5:
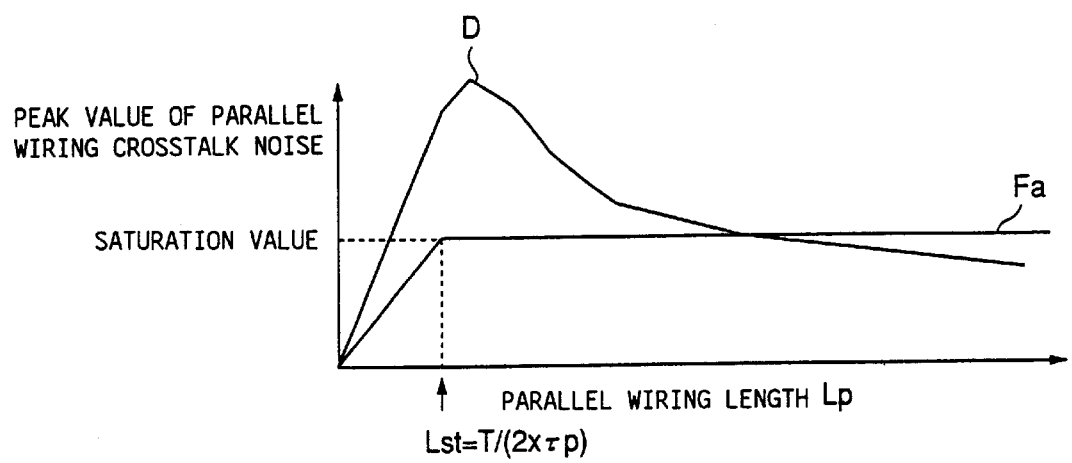
FIG. 5 is a diagram for explaining the embodiment of the crosstalk noise calculation method according to the present invention.

FIG. 5 is a diagram for explaining this embodiment of the crosstalk noise calculation method. In FIG. 5, the ordinate indicates a peak value of the crosstalk noise, and the abscissa indicates a parallel wiring length.

Figure 1:
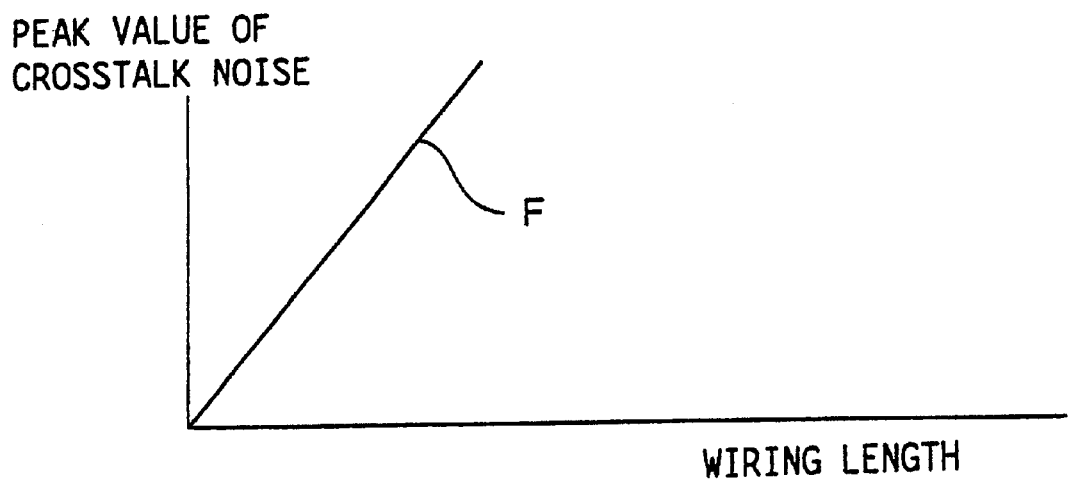
FIG. 1 is a diagram for explaining a conventional crosstalk noise calculation method.

As may be seen from a comparison of FIG. 5 and FIG. 1, the crosstalk noise is conventionally calculated using the function F by assuming that the peak value of the crosstalk noise is simply proportional to the adjacent wiring length, but this embodiment takes into consideration the increased operation speed of the recent CPUs and the reduced cost of the high-speed elements. More particularly, this embodiment takes into consideration the increased wiring density on the assembling board or the like, the increased wiring length, and the increased transfer rates of signals flowing through the wirings, and calculates the crosstalk noise by use of a function Fa by noting that the peak value of the crosstalk noise saturates and becomes approximately constant when the peak value exceeds a predetermined wiring length.

In FIG. 5, D indicates an example of a parallel wiring length distribution on a substrate. When a delay time per unit length of the wiring on the substrate is denoted by $\tau p$, a rise/fall time of an output circuit on the substrate is denoted by T, and a saturating wiring length is denoted by Lst, the saturating wiring length Lst can be described by Lst=T/(2$\tau$p). For example, the delay time $\tau$p is approximately 70 ps/cm, the rise/fall time T is approximately 500 ps to 1500 ps, and the saturating wiring length Lst is approximately 3 cm to 10 cm.

(1) Method of Calculating Parallel Crosstalk Noise of Parallel Wiring Including Inter-Layer And Intra-Layer Wirings:

Next, a description will be given of the details of the process carried out in the step S4. The parallel crosstalk noise of the parallel wirings, including inter-layer and intra-layer wirings on the substrate, can be calculated by the following calculation method.

(1.1) In The Case of N Net:

Between parallel wirings, there are two kinds of parallel crosstalk noises generated by a target d-ing net, namely, a parallel crosstalk noise caused by propagating waves and a parallel crosstalk noise caused by reflected waves. The parallel crosstalk noise caused by 1 d-ing net with respect to a target d-ed net can be obtained by composing the parallel crosstalk noises caused by these two kinds of waves.

Figure 6:
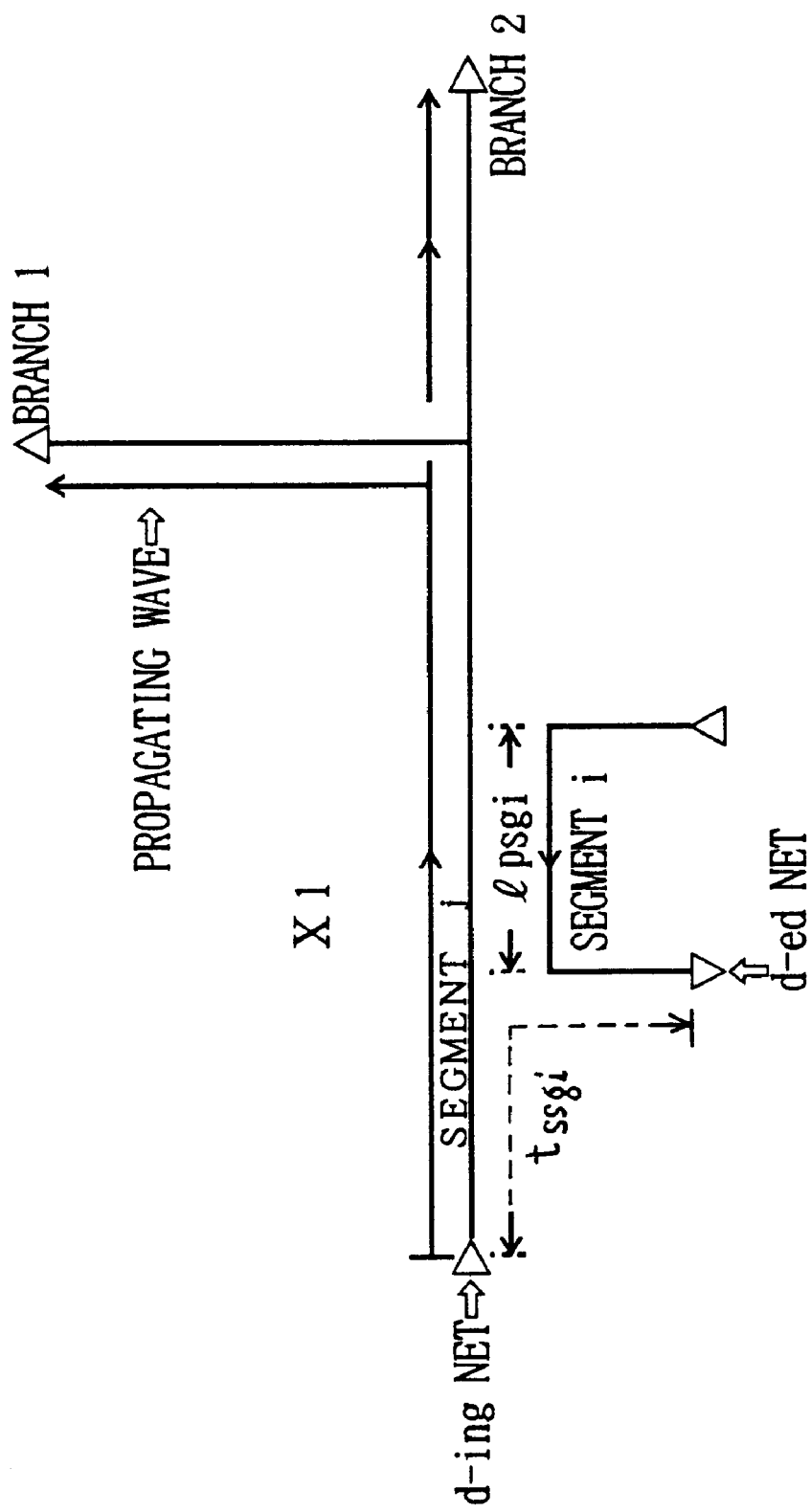
FIG. 6 is a diagram for explaining a parallel crosstalk noise caused by propagating waves.

(1.1.1) Parallel Crosstalk Noise Caused By Propagating Waves:

FIG. 6 is a diagram for explaining a parallel crosstalk noise caused by the propagating waves. In FIG. 6, a d-ing net has branches 1 and 2, and the propagating waves propagate as indicated by arrows. On the other hand, a d-ed net has a wiring part (hereinafter referred to as a segment i) which is adjacent to the d-ing net and is parallel to a part of the d-ing net. In other words, the signals propagate in mutually opposite directions between the mutually parallel parts of the d-ing net and the d-ed net.

In FIG. 6, lpsgi denotes a length of the segment i, and this segment length lpsgi is set less than or equal to a limit value $L_{SEG}$ of the segment length. When the segment length lpsgi exceeds the limit value $L_{SEG}$, the segment i is divided into 2 or more segments so that the length of each segment does not exceed the limit value $L_{SEG}$.

When dividing the segment, the segment is divided into units which are sufficiently smaller than a wavelength of a main frequency component of a signal voltage flowing through the segment.

A wiring delay tssgi of a parallel crosstalk noise propagation path of the d-ing net from an input pin to the d-ed net can be obtained as follows. That is, the parallel crosstalk noise propagation path is divided into a segment j at least at a part X1 where a change is made to another wiring layer. Moreover, the wiring delay is calculated for each segment, and a sum total of the wiring delays calculated for each of the segments is regarded as the wiring delay tssgi. Accordingly, when a wiring delay of the segment j of the papagation path is denoted by tpsgj, the wiring delay tssgi can be described by the following formula.

$$tssgi = \sum_{j=1 \sim M} tpsgj$$

When a delay time per unit length of the wiring pattern is denoted by $\tau_{MCM}$ (ps/cm), the wiring delay tpsgj of the segment j of the papagation path can be described by tpsgj=$\tau_{MCM}$·lpsgi. In addition, the wiring delay tpsgi of the segment i can be described by tpsgi=$\tau_{MCM}$·lpsgi.

A peak value LNsgi of the parallel crosstalk noise generated at the segment i can be obtained from the following formula.

$$LNsgi = LNsgi_{CNV} \cdot \exp\left(-\sum_{j=1 \sim M} Kdecj \cdot lpsgj\right) \cdot C_{PL}rd$$

In the formula above, $LNsgi_{CNV}$ indicates a peak value of the crosstalk noise generated at the segment i when there is no loss. This peak value $Lnsig_{CNV}$ can be obtained as a function of the dimensions and materials of the adjacent wiring pattern and the peripheral part medium, the gap between the wiring patterns, and the parallel wiring length. In addition, Kdecj indicates an attenuation constant of the segment j, which is determined by electrical conditions such as the specifications of the wiring board, the wiring layer and the wiring width, and this attenuation constant Kdecj is defined for each of the wiring layers. Further, $C_{PL}rd$ indicates a reduction coefficient of the parallel crosstalk noise prescribed by a net code of the d-ed net, that is, the kind of net. This reduction coefficient $C_{PL}rd$ takes into consideration the attenuation effect of the input capacitance and the like. Therefore, in the above formula describing the peak value LNsgi of the parallel crosstalk noise generated at the segment i, the second term on the right hand side of the equation, that is, $$\exp\left(-\sum_{j=1 \sim M} Kdecj \cdot lpsgj\right)$$

takes into consideration the attenuation effect of the wiring resistance.

Figure 7:
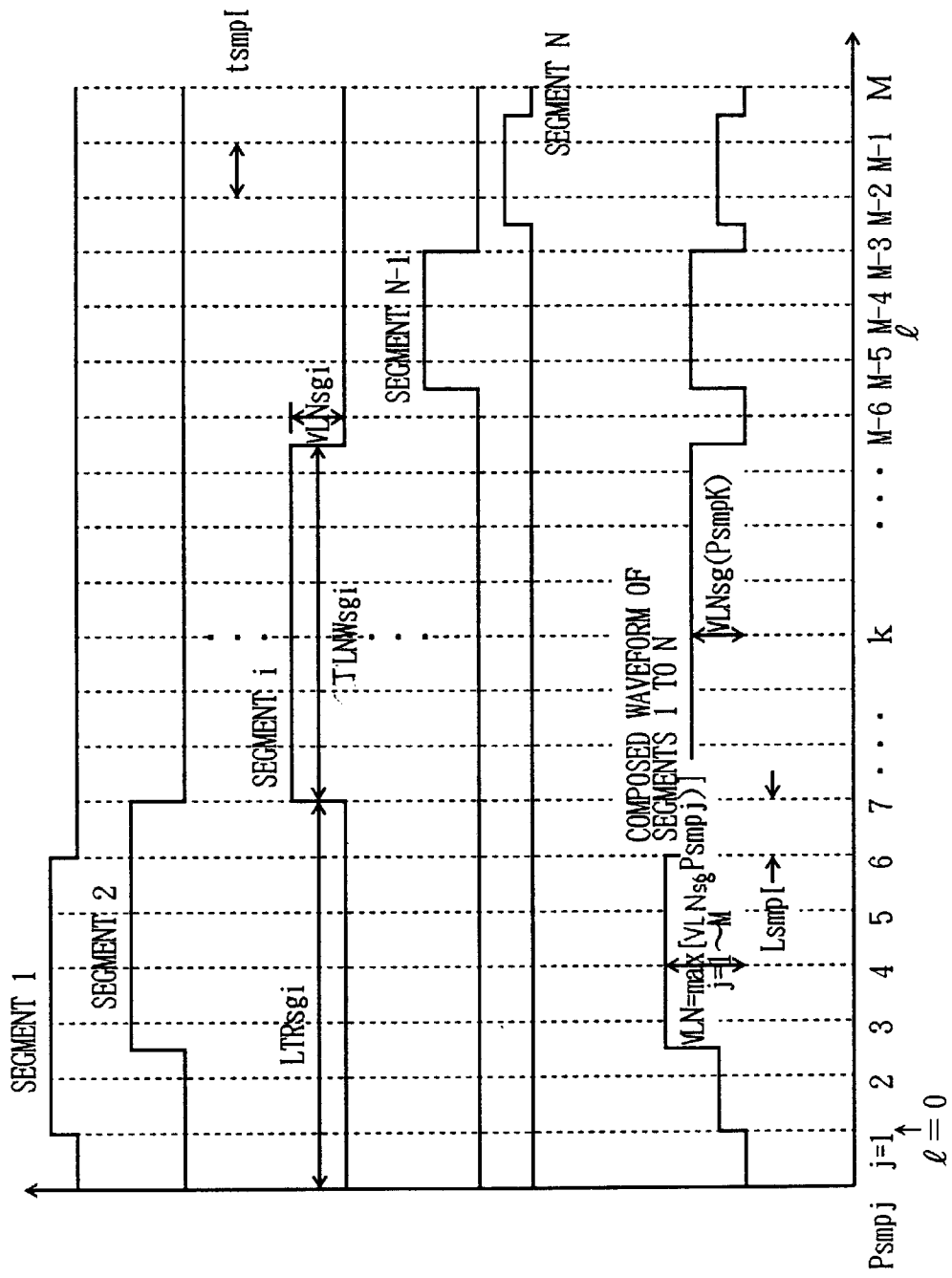
FIG. 7 is a diagram for explaining composing of parallel crosstalk noise caused by 1 d-ing net adjacent to a d-ed net.

FIG. 7 is a diagram for explaining composing of parallel crosstalk noise caused by 1 d-ing net adjacent to a d-ed net. In FIG. 7, tsmpI denotes a sampling interval at which the parallel crosstalk noise is calculated, where tsmpI≦50 ps, PsmpjN denotes a sampling point where the parallel crosstalk noise is calculated, N denotes a total number of adjacent segments, M denotes a sum total of the sampling points, VLNsg(Psmpj) denotes a noise value at a sampling point Psmpj of a composed waveform of noise waveforms of the segments 1 through N, TLNWsgi denotes a width of the parallel crosstalk noise at a segment i, and TLTRsgi denotes a delay time of the parallel crosstalk noise of the segment i.

The width TLNWsgi of the parallel crosstalk noise can be obtained as follows depending on the conditions.

TLNWsgi=TRFd-ing if 2·tpsgi≦TRFd-ing

TLNWsgi=2·tpsgi if 2·tpsgi>TRFd-ing

In addition, the delay time TLTRsgi of the parallel crosstalk noise at the segment i can be obtained as follows depending on the conditions.

TLTRsgi=tssgi+tpsgi if 2·tpsgi≦TRFd-ing

TLTRsgi=tssgi+TRFd-ing/2 if 2·tpsgi>TRFd-ing

In this embodiment, a parallel crosstalk noise VLN caused by 1 adjacent d-ing net which is adjacent to a target d-ed net can be obtained from the following formula (1).

$$VLN = \max_{j=1 \sim M} [VLNsg(Psmpj)] \quad (1)$$

Figure 8:
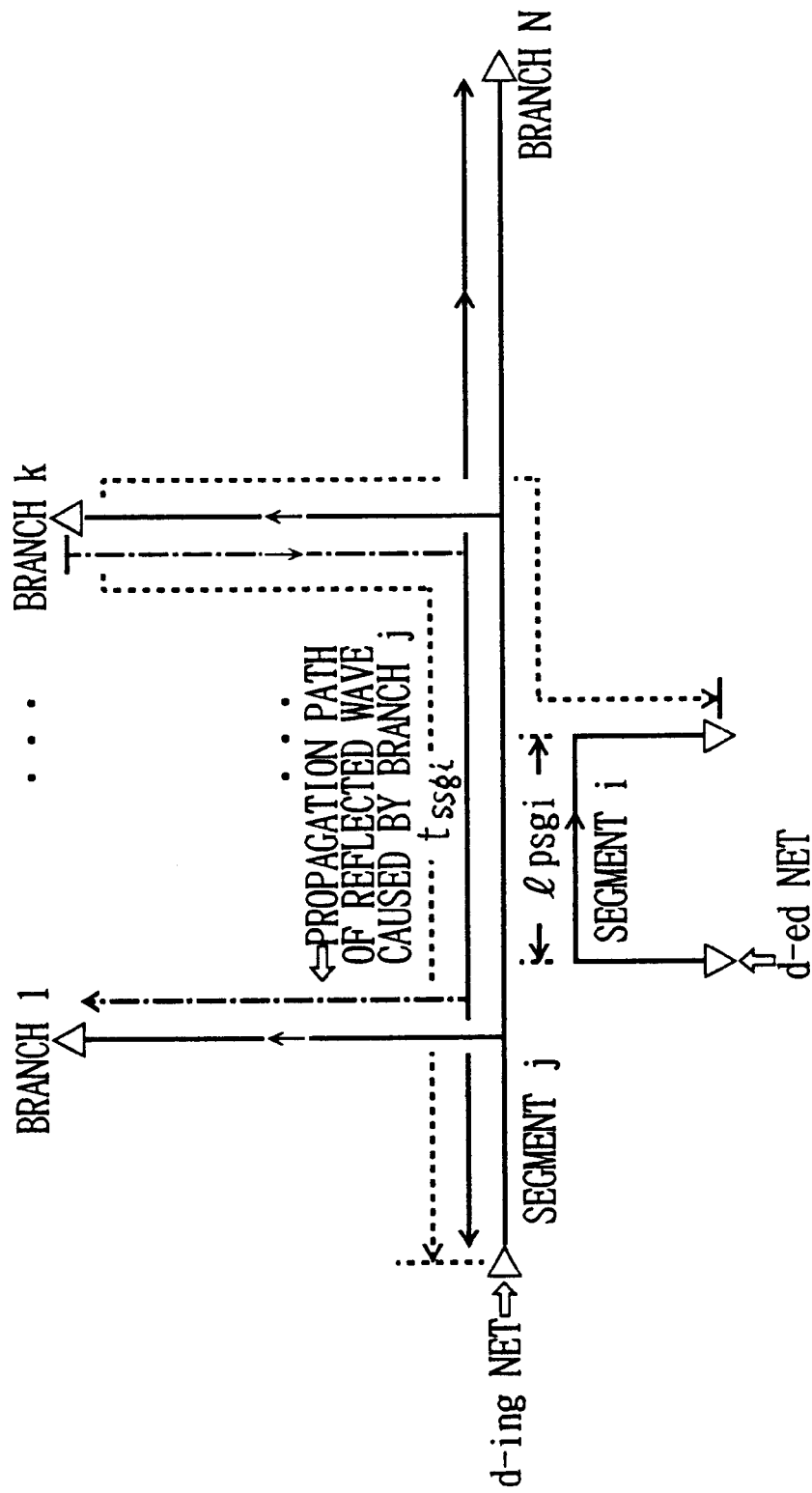
FIG. 8 is a diagram for explaining a parallel crosstalk noise caused by reflected waves.

(1.1.2) Parallel Crosstalk Noise Caused By Reflected Waves:

FIG. 8 is a diagram for explaining a parallel crosstalk noise caused by reflected waves. In FIG. 8, those parts which are the same as those corresponding parts in FIGS. 6 and 7 are designated by the same reference numerals, and a description thereof will be omitted.

The reflected waves are generated when the propagating waves from a driver are reflected at a receiver end of each branch. Accordingly, by calculating the parallel crosstalk noise of the reflected waves for each of the branches and finally composing the calculated parallel crosstalk noises, it is possible to calculate the parallel crosstalk noise caused by the reflected waves. The reflected waves generated by 1 branch k are as shown in FIG. 8. The method of calculating the parallel crosstalk noise generated in the target d-ed net by the reflected waves of the branch k is similar to the calculation method with respect to the propagating waves described above under item (1.1.1).

If a plurality of receivers exist within the target d-ed net, the parallel crosstalk noise is calculated according to the above described method for all of the receivers. From among the calculated parallel crosstalk noises, the calculated parallel noise having a maximum value is regarded as the parallel crosstalk noise of the target d-ed net. (1.2) In The Case of M:N Net:

In the case of a M:N bidirectional net, the parallel crosstalk noise caused by 1 adjacent d-ing net which is adjacent to the target d-ed net is calculated as follows.

Figure 9:
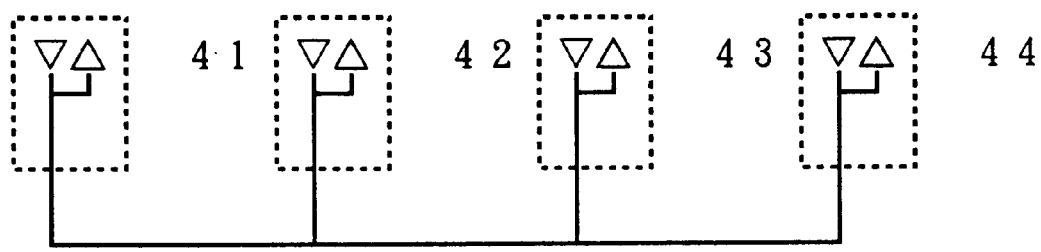
FIG. 9 is a diagram for explaining the calculation of a parallel crosstalk noise caused by 1 d-ing net adjacent to a target d-ed net in a case of a M:N bidirectional net.
Figure 10:
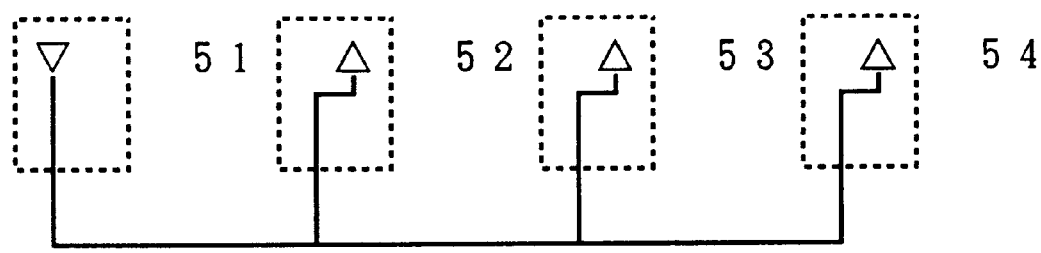
FIG. 10 is a diagram for explaining the calculation of the parallel crosstalk noise caused by the 1 d-ing net adjacent to the target d-ed net in the case of the M:N bidirectional net.

Only 1 of the drivers of the target d-ed net is regarded as the driver, and all of the other drivers are regarded as receivers. In other words, the parallel crosstalk noise is calculated similarly to the parallel crosstalk noise of the propagating waves described above under item (1.1.1), by assuming a 1: (N+M−1) net. For example, if 4 drivers 41 through 44 exist in the d-ing net as shown in FIG. 9, the driver 41 is regarded as a target driver 51, and the other drivers 42 through 44 are regarded as receivers 52 through 54, as shown in FIG. 10. Hence, the parallel crosstalk noise can be calculated similarly as in the case of the propagating waves described above under item (1.1.1), based on the d-ing net shown in FIG. 10.

Such a process is carried out with respect to each of the drivers 41 through 44, and the parallel crosstalk noise is calculated for each case where one of the drivers 41 through 44 is regarded as the driver while the others are regarded as the receivers. From among the calculated parallel crosstalk noises, the parallel crosstalk noise having a maximum value is regarded as the parallel crosstalk noise caused by 1 d-ing net which is adjacent to the target d-ed net.

Figure 11:
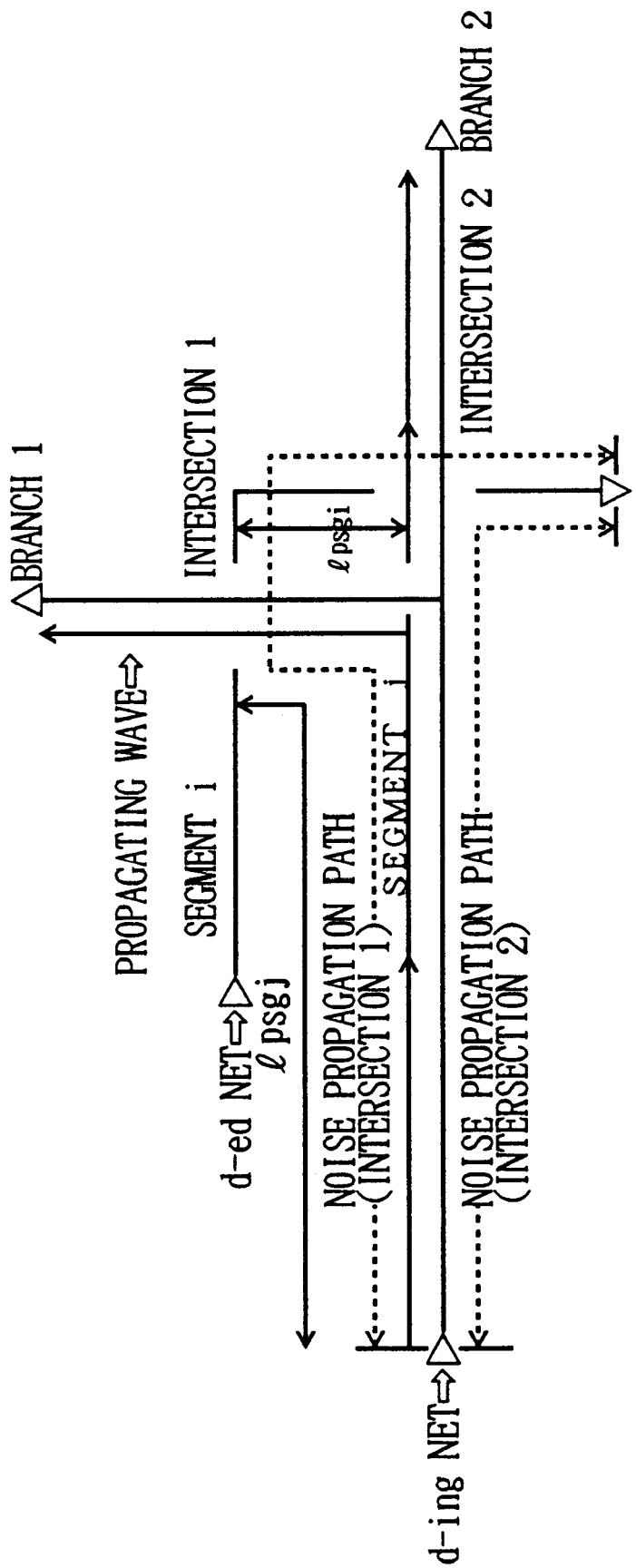
FIG. 11 is a diagram for explaining an intersection crosstalk noise.

(2) Calculation of Intersection Crosstalk Noise:

FIG. 11 is a diagram for explaining an intersection crosstalk noise. In FIG. 11, those parts which are the same as those corresponding parts in FIGS. 6 and 7 are designated by the same reference numerals, and a description thereof will be omitted.

(2.1) In The Case of 1:N Net:

In the case of a 1:N bidirectional net, an intersection crosstalk noise Neff caused by 1 d-ing net which is adjacent to the target d-ed net can be calculated based on the following formula (2), where $C_{CR}rd$ denotes a reduction coefficient of the intersection crosstalk noise prescribed by a net code of the d-ed net, and $K_{CR}$ denotes an intersection crosstalk noise generated by an intersection when there is no loss. The intersection crosstalk noise $K_{CR}$ which is generated by the intersection when there is no loss, may be calculated as a function of dimensions and material of a peripheral part medium of the intersecting wiring patterns.

$$Neff = \sum_{\substack{Sum\ Total\ For\\ All\ Intersections}} \left[ K_{Cr} \cdot \exp\left(-\sum_{j=1 \sim M} Kdecj \cdot lpsgj\right) \cdot C_{CR}rd \right] \quad (2)$$

(2.2) In The Case of M:N Net:

In the case of a M:N bidirectional net, an intersection crosstalk noise Neff caused by 1 d-ing et which is adjacent to the target d-ed net can be calculated similarly as described under item (1.2) above, by regarding only 1 of the drivers of the target d-ed net as the driver and regarding all the other drivers as receivers. In other words, the intersection crosstalk noise Neff can be calculated similarly to the case of the propagating waves described under item (1.1.1) above by assuming a 1: (N+M−1) net.

Such a process is carried out for all of the drivers to calculate the intersection crosstalk noises for each case where one of the drivers is regarded as the driver while the others are regarded as the receivers. From among the calculated intersection crosstalk noises, the intersection crosstalk noise having a maximum value is regarded as the intersection crosstalk noise Neff caused by 1 d-ing net which is adjacent to the target d-ed net.

The present inventor conducted experiments to compare the conventional method and this embodiment of the method, with respect to a case where a total number of nets of the wirings on the assembling board of a computer is 2200. According to the conventional method, a number of erroneous nets for which the crosstalk noise from the adjacent wiring exceeds the tolerable range was 600, but the number of erroneous nets was 100 according to this embodiment of the method. In other words, it was confirmed that this embodiment can prevent an excessively strict checking by reducing the number of erroneous nets to a range such that the erroneous nets can be sufficiently corrected.

Further, the present invention is not limited to these embodiments, but various variations and modifications may be made without departing from the scope of the present invention.

What is claimed is:

1. A crosstalk noise calculation method for calculating crosstalk noise among a plurality of wirings, comprising:
   calculating a crosstalk noise using a function in which the crosstalk noise becomes approximately constant when a predetermined wiring length is exceeded,
   wherein said calculating a crosstalk noise comprises:
      separating a signal flowing through a first wiring into a propagating, wave component and a reflected wave component;
      calculating crosstalk noises caused by the first wiring with respect to a second wiring which is adjacent to the first wiring independently for the propagating wave component and the reflected wave component; and
      calculating the crosstalk noise with respect to the second wiring by composing the crosstalk noises calculated independently for the propagating wave component and the reflected wave component.

2. The crosstalk noise calculation method as claimed in claim 1, wherein said calculating a crosstalk noise calculates a parallel crosstalk noise caused by one of mutually coupled parallel wirings with respect to the other of the mutually coupled parallel wirings.

3. The crosstalk noise calculation method as claimed in claim 1, wherein said function has a change in the crosstalk noise caused by electrical conditions comprising specifications of a substrate on which the wirings are formed and wiring layers forming the wirings and wiring widths.

4. A crosstalk noise calculation method for calculating crosstalk noise among a plurality of wirings, comprising:
   calculating a crosstalk noise using a function in which the crosstalk noise becomes approximately constant when a predetermined wiring length is exceeded,
   wherein said calculating a crosstalk noise comprises:
      calculating an intersection crosstalk noise caused by one of mutually intersecting wirings with respect to the other of the mutually intersecting wirings.

5. A crosstalk noise calculation method for calculating crosstalk noise among a plurality of wirings, comprising:
   calculating a crosstalk noise using a function in which the crosstalk noise becomes approximately constant when a predetermined wiring length is exceeded,
   wherein said calculating a crosstalk noise comprises:
      dividing a wiring into a plurality of segments sufficiently smaller than a wavelength of a main frequency component of a signal flowing through the wiring; and
      calculating the crosstalk noise with respect to the wiring which is formed by the plurality of segments by composing crosstalk noises calculated with respect to each of the segments.

6. The crosstalk noise calculation method as claimed in claim 5, wherein said function has a decrease which occurs in a signal amplitude with respect to each of the segments when the crosstalk noise propagates through the wiring.

7. A computer-readable storage medium that stores a program causing a computer to calculate crosstalk noise among a plurality of wirings on a substrate, comprising:
   calculating means for causing the computer to calculate a crosstalk noise using a function in which the crosstalk noise becomes approximately constant when a predetermined wiring length is exceeded,
   wherein said calculating means comprises:
      means for causing the computer to separate a signal flowing through a first wiring into a propagating wave component and a reflected wave component;
      means for causing the computer to calculate crosstalk noises caused by the first wiring with respect to a second wiring which is adjacent to the first wiring independently for the propagating wave component and the reflected wave component; and
      means for causing the computer to calculate the crosstalk noise with respect to the second wiring by composing the crosstalk noises calculated independently for the propagating wave component and the reflected wave component.

8. The computer-readable storage medium as claimed in claim 7, wherein said calculating means causes the computer to calculate a parallel crosstalk noise caused by one of mutually coupled parallel wirings with respect to the other of the mutually coupled parallel wirings.

9. The computer-readable storage medium as claimed in claim 7, wherein said function has a change in the crosstalk noise caused by electrical conditions comprising specifications of the substrate on which the wirings are formed and wiring layers forming the wirings and wiring widths.

10. A computer-readable storage medium that stores a program causing a computer to calculate crosstalk noise among a plurality of wirings on a substrate, comprising:
    calculating means for causing the computer to calculate a crosstalk noise using a function in which the crosstalk noise becomes approximately constant when a predetermined wiring length is exceed,
    wherein said calculating means causes the computer to calculate an intersection crosstalk noise caused by one of mutually intersecting wirings with respect to the other of the mutually intersecting wirings.

11. A computer-readable storage medium that stores a program for causing a computer to calculate crosstalk noise among a plurality of wirings on a substrate, comprising:
    calculating means for causing the computer to calculate a crosstalk noise using a function in which the crosstalk noise becomes approximately constant when a predetermined wiring length is exceeded,
    wherein said calculating means comprises:
       means for causing the computer to divide a wiring into a plurality of segments sufficiently smaller than a wavelength of a main frequency component of a signal flowing through the wiring; and
       means for causing the computer to calculate the crosstalk noise with respect to the wiring which is formed by the plurality of segments by composing crosstalk noises calculated with respect to each of the segments.

12. The computer-readable storage medium as claimed in claim 11, wherein said function has a decrease which occurs in a signal amplitude with respect to each of the segments when the crosstalk noise propagates through the wiring.

13. A crosstalk noise calculation method, comprising:
    separating a signal flowing through a first wiring into a propagating wave component and a reflected wave component;
    calculating crosstalk noises caused by the first wiring with respect to a second wiring that is adjacent to the first wiring independently for the propagating wave component and the reflected wave component; and
    calculating a crosstalk noise with respect to the second wiring by composing the crosstalk noises calculated independently for the propagating wave component and the reflected wave component.

14. The crosstalk noise calculation method, comprising:
    calculating an intersection crosstalk noise caused by one of mutually intersecting wirings with respect to another of the mutually intersecting wirings.

15. A crosstalk noise calculation method, comprising:

dividing a wiring into a plurality of segments sufficiently smaller than a wavelength of a main frequency component of a signal flowing through the wiring; and calculating a crosstalk noise with respect to the wiring that is formed by the plurality of segments by composing crosstalk noises calculated with respect to each of the segments.

16. A computer-readable storage controlling a computer to calculate crosstalk noise, comprising a process of:

causing the computer to separate a signal flowing through a first wiring into a propagating wave component and a reflected wave component;

calculating crosstalk noises caused by the first wiring with respect to a second wiring that is adjacent to the first wiring independently for the propagating wave component and the reflected wave component; and calculating the crosstalk noise with respect to the second wiring by composing the crosstalk noises calculated independently for the propagating wave component and the reflected wave component.

17. A computer-readable storage controlling a computer to calculate crosstalk noise, comprising a process of:

calculating an intersection crosstalk noise caused by one of mutually intersecting wirings with respect to another of the mutually intersection wirings.

18. A computer-readable storage controlling a computer to calculate crosstalk noise, comprising a process of:

dividing a wiring into a plurality of segments sufficiently smaller than a wavelength of a main frequency component of a signal flowing through the wiring; and calculating a crosstalk noise with respect to the wiring that is formed by the plurality of segments by composing crosstalk noises calculated with respect to each of the segments.

* * * * *

UNITED STATES PATENT AND TRADEMARK OFFICE
CERTIFICATE OF CORRECTION

PATENT NO. : 6,278,951 B1  
DATED : August 21, 2001  
INVENTOR(S) : Toshiro Sato Page 1 of 1

It is certified that error appears in the above-identified patent and that said Letters Patent is hereby corrected as shown below:

Column 10,
Line 26, change "exceed" to -- exceeded --.
Lines 64-67, delete claim 14 in its entirety.

Column 12,
Lines 3-7, delete claim 17 in its entirety.

Signed and Sealed this

Sixteenth Day of April, 2002

Attest:

Attesting Officer

JAMES E. ROGAN
*Director of the United States Patent and Trademark Office*